United States Patent
Choi et al.

(10) Patent No.: US 9,811,060 B2
(45) Date of Patent: Nov. 7, 2017

(54) AUTOMATIC CHECKING, VALIDATION, AND POST-PROCESSING OF A BATTERY OBJECT

(75) Inventors: Sangeun Choi, Simsbury, CT (US); Srinivas Nidamarthi, Auburn Hills, MI (US); Michael M. Rickin, Shaker Heights, OH (US)

(73) Assignee: ABB Schweiz AG, Baden (CH)

( * ) Notice: Subject to any disclaimer, the term of this patent is extended or adjusted under 35 U.S.C. 154(b) by 706 days.

(21) Appl. No.: 13/994,558

(22) PCT Filed: Dec. 14, 2011

(86) PCT No.: PCT/US2011/064949
§ 371 (c)(1),
(2), (4) Date: Aug. 3, 2013

(87) PCT Pub. No.: WO2012/082922
PCT Pub. Date: Jun. 21, 2012

(65) Prior Publication Data
US 2013/0317639 A1 Nov. 28, 2013

Related U.S. Application Data

(60) Provisional application No. 61/422,717, filed on Dec. 14, 2010.

(51) Int. Cl.
*G05B 15/02* (2006.01)
*G01R 31/36* (2006.01)
*H01M 10/42* (2006.01)

(52) U.S. Cl.
CPC ......... *G05B 15/02* (2013.01); *G01R 31/3631* (2013.01); *H01M 10/4285* (2013.01)

(58) Field of Classification Search
CPC ........... H01M 10/4285; G01R 31/3631; G01N 35/00584
See application file for complete search history.

(56) References Cited

U.S. PATENT DOCUMENTS 4,376,485 A * 3/1983 Shah ................. B07C 5/344
209/575
5,469,064 A * 11/1995 Kerschner ............... G01R 1/07
324/537
(Continued)

FOREIGN PATENT DOCUMENTS

GB 2291737 A 1/1996

OTHER PUBLICATIONS

European Patent Office, International Search Report, PCT/US2011/064949 dated Dec. 14, 2011, dated Mar. 5, 2012.

*Primary Examiner* — Jason Lin
(74) *Attorney, Agent, or Firm* — Taft Stettinius & Hollister LLP

(57) ABSTRACT

A machine such as an industrial robot operates either in a stand-alone or in-production mode to perform a number of tests on a battery object having one of several different assembly levels and packaging geometries. The machine has selectable testing programs that correspond to various combinations of object assembly levels and geometries. The machine performs the tests either by coming into contact with a predetermined location on the conductive material of the object or viewing that location. The test results are analyzed to determining if retesting is necessary. After all of the tests are completed on an object, the tested object is assigned a grade and then sorted by grade. The tested objects may be kept at the machine location or sent on for further processing based on the assigned grade. After the testing is completed on one object, the machine tests the next object to be tested.

26 Claims, 6 Drawing Sheets

(56) References Cited

U.S. PATENT DOCUMENTS

| | | | | |
|---|---|---|---|---|
| 7,317,298 B1* | 1/2008 | Burns | ............... | H01M 10/48 |
| | | | | 320/107 |
| 2003/0184262 A1* | 10/2003 | Makhija | ............ | H02J 7/0047 |
| | | | | 320/130 |
| 2004/0155626 A1* | 8/2004 | Hedegor | ............ | B07C 5/344 |
| | | | | 320/116 |
| 2005/0017726 A1* | 1/2005 | Koran | ............... | G01R 31/007 |
| | | | | 324/433 |
| 2011/0316546 A1* | 12/2011 | Bruno | ............... | H01R 13/193 |
| | | | | 324/426 |

* cited by examiner

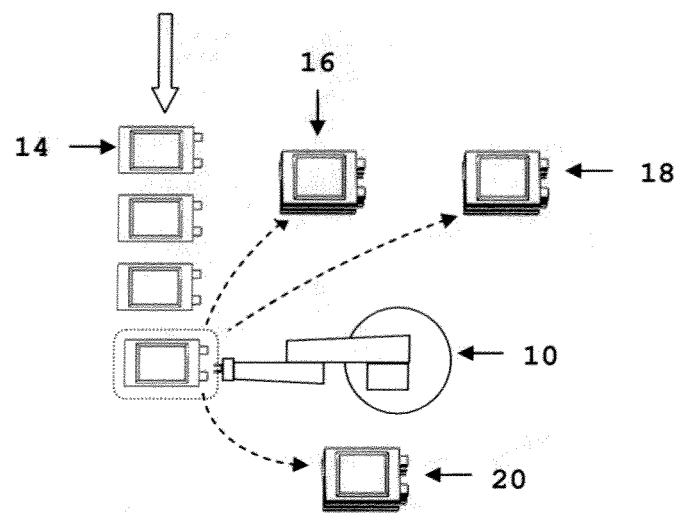
Fig. 2a (Stand-alone case)
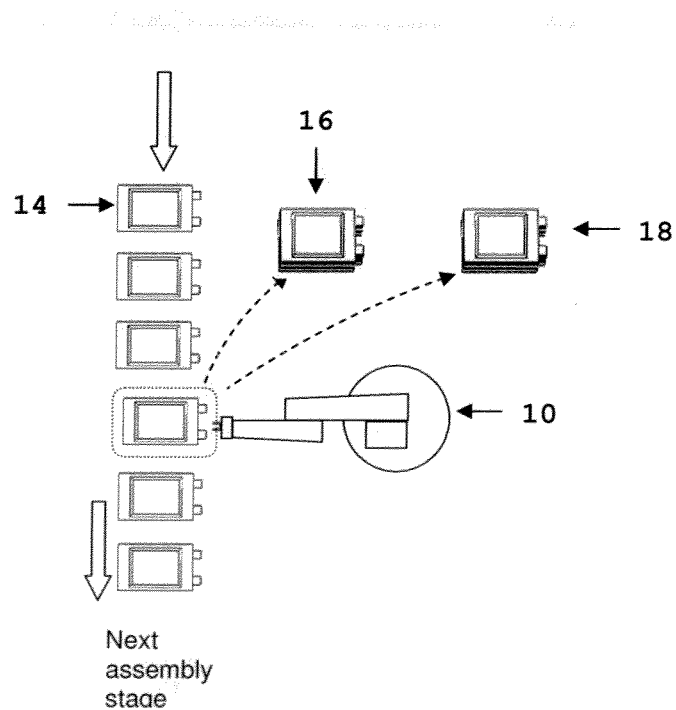
Fig. 2b (In-production case)

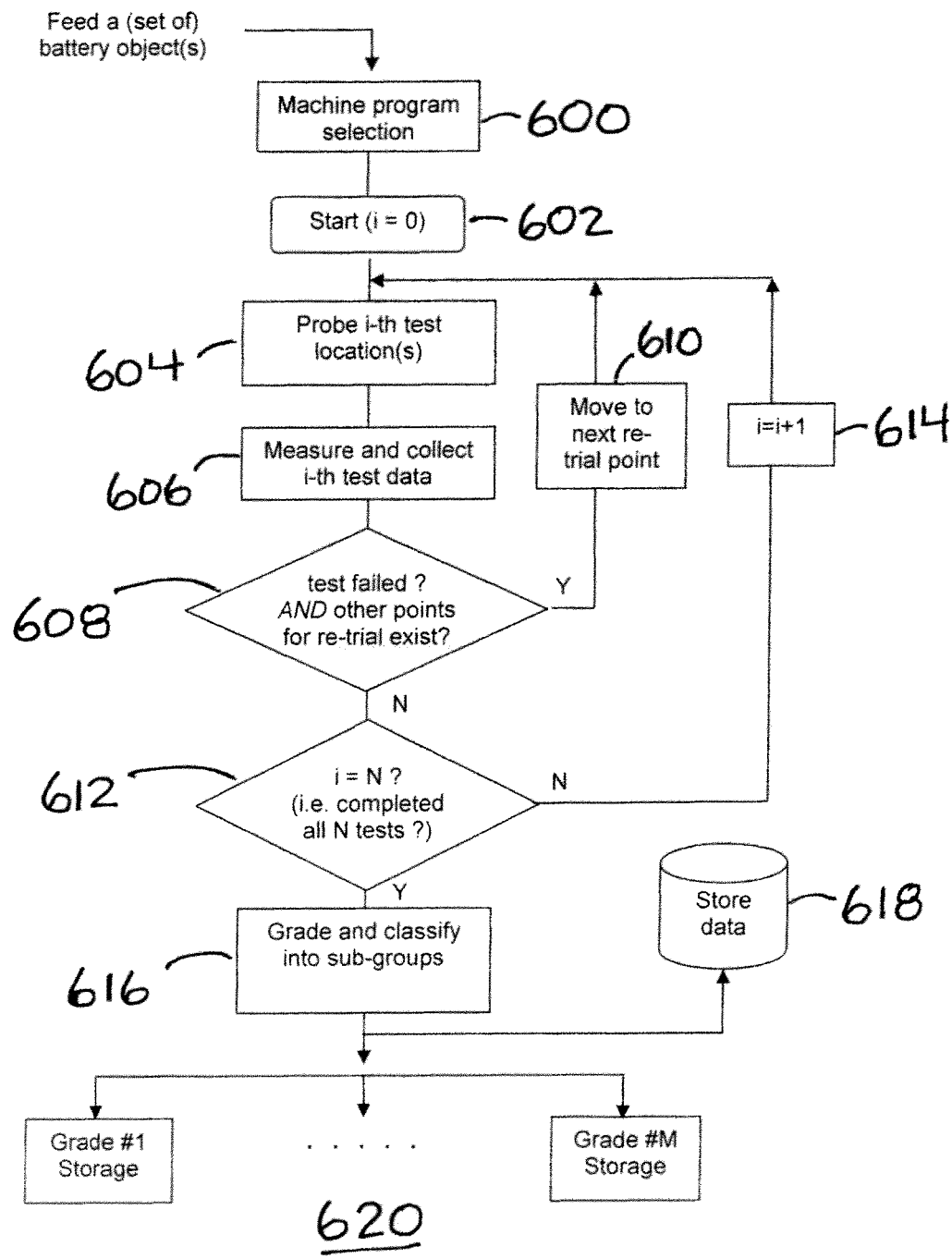
Fig. 6a (Stand-alone case)

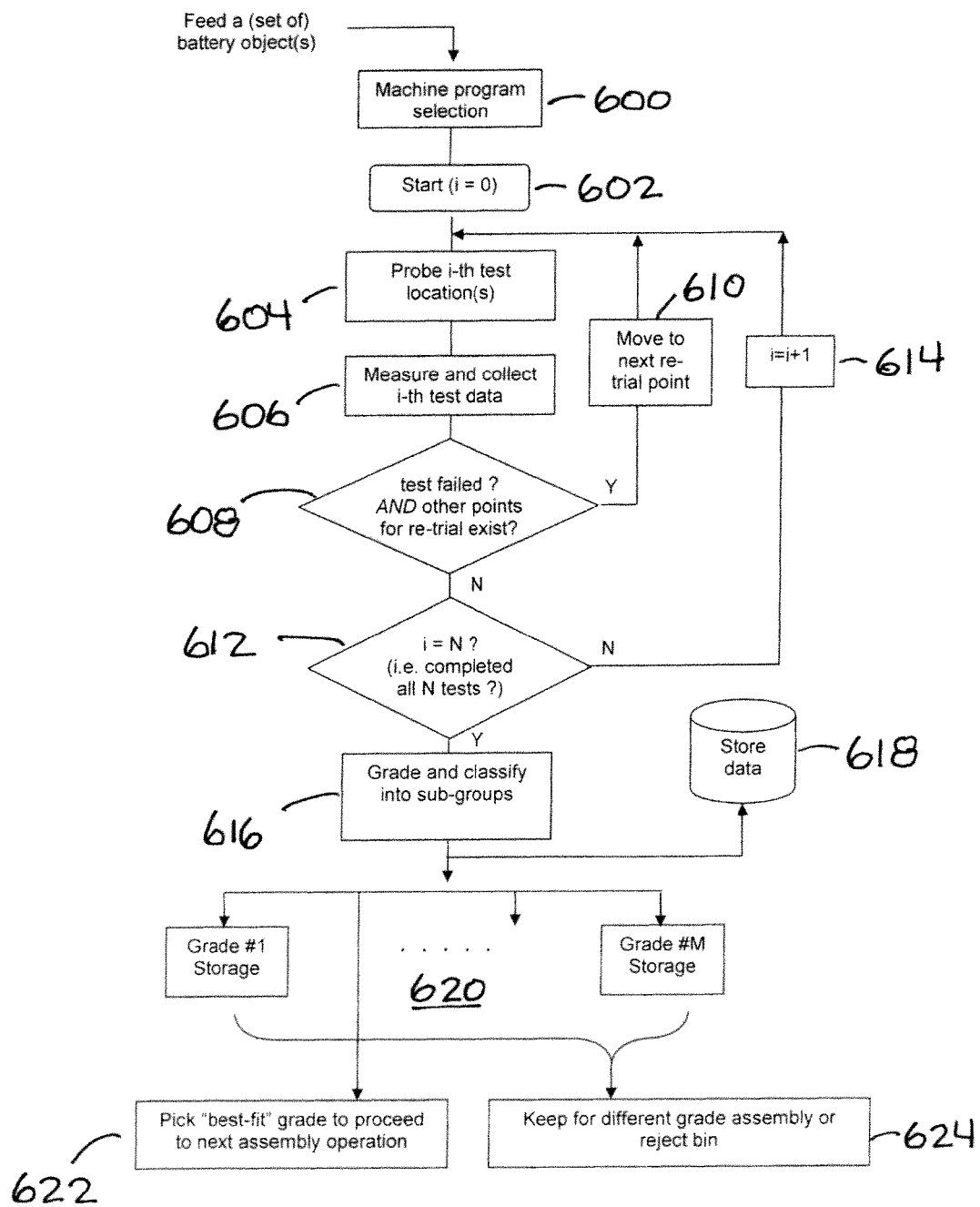
Fig. 6b (In-production case)

AUTOMATIC CHECKING, VALIDATION, AND POST-PROCESSING OF A BATTERY OBJECT

1. FIELD OF THE INVENTION

This invention relates to batteries that exist in any one of several assembly levels and more particular to the automatic checking, validation and post-processing of batteries.

2. DESCRIPTION OF THE PRIOR ART

The battery-manufacturing industry has developed dramatically for the past two decades most likely on account of the continuing heavy demands from hand-held/portable electronics, and more recently the emergence of hybrid-electric or plug-in hybrid electric vehicles.

Batteries exist in different hierarchical assembly levels taking forms such as a cell, a cartridge (or a cassette), a module, or a pack. The term "battery object" is used herein to refer to batteries that may exist in any one of those assembly levels.

Battery cell production involves processes, such as stacking of electrode layers, insertion of separators, welding/joining of individual layers, electrolyte injections, formation (activation of charge carrying materials & first time charging), and testing. Once a battery cell is completed into a self-contained packaged form, the cells are transferred to and put through a module-level assembly line, where the individual cells are sub-assembled into a cartridge (or a cassette) although not all of the time, or a module. Finally, the modules are stacked into a final, usable integrated form known as a pack. Among the many important elements in battery assembly are stacking and joining. An individual battery cell or module is sequentially stacked typically in the vertical direction. The stacking is followed by joining, where the sequentially stacked battery cell or module is typically laser or ultrasonically welded or fastened together as for example by using nuts and bolts to form a self-contained package for the next assembly level. That next assembly level depends on the form of the self contained package and may for example be from the cell-level to the module-level or from the module-level to the pack-level.

If it is found after assembly that defective cells have been included in the assembly and those cells or modules have the potential to damage or harm the product in which the cells are to be used, then it is not in most cases easy to separate the good cells from the defective cells.

While there are a few situations where some defective battery components are packed in without a significant performance degradation of the entire assembly, it is most likely that the entire battery object must be discarded. That is a costly waste of good components and reduced productivity.

Therefore, it is desired to use battery testing equipment to inspect and check a battery object of any assembly level throughout the entire assembly process.

Commonly used battery testing equipment in the battery manufacturing industry can today take several typical forms depending on the level of assembly. This testing equipment are dedicated machines. They are typically very expensive and do not provide flexibility or compatibility to the different levels of assembly or the changes of the model/type of the battery objects to be produced.

SUMMARY OF THE INVENTION

A system for controlling a machine to perform predetermined tests on a battery object. The system has:

a computing device having therein program code usable by the computing device, the program code has:

code configured to cause the machine to be positioned at predetermined locations on conductive material of the battery object, each of the predetermined locations associated with one or more of the predetermined tests;

code configured to cause the machine to perform the one or more of the predetermined tests that is associated with each of the predetermined locations;

code configured to analyze the results of the performed one or more of the predetermined tests and determine if retesting of the performed one or more of the predetermined tests is needed; and code configured to determine if all of the predetermined tests have been performed on the battery object.

A computer program product for controlling a machine to perform predetermined tests on a battery object. The computer program product has:

computer usable program code configured to cause the machine to be positioned at predetermined locations on conductive material of the battery object, each of the predetermined locations associated with one or more of the predetermined tests;

computer usable program code configured to cause the machine to perform the one or more of the predetermined tests that is associated with each of the predetermined locations;

computer usable program code configured to analyze the results of the performed one or more of the predetermined tests and determine if retesting of the performed one or more of the predetermined tests is needed; and computer usable program code configured to determine if all of the predetermined tests have been performed on the battery object.

A method for performing predetermined tests on a battery object. The method:

causes a machine for performing the predetermined tests to be positioned at predetermined locations on conductive material of the battery object, each of the predetermined locations associated with one or more of the predetermined tests;

causes the machine to perform the one or more of the predetermined tests associated with each of the predetermined locations;

analyzes the results of the performed one or more of the predetermined tests and determine if retesting of the performed one or more of the predetermined tests is needed; and determines if all of the predetermined tests have been performed on the battery object.

A machine for testing battery objects. The battery objects to be tested are grouped in a plurality of sets of one or more battery objects with the one or more battery objects in a first of the sets of battery objects having an identical set of characteristics which are different than the set of identical characteristics of one or more battery objects in a second set of battery objects to be tested. The machine has:

a computing device having therein program code usable by the computing device. The program code has:

code configured to cause the machine to select from a plurality of testing programs each associated with a respective one of the plurality of sets of battery objects to be tested a testing program associated with the first set of battery objects to be tested, each of the testing programs has a predetermined number of tests to be performed on the associated one of the plurality of sets of battery objects;

code configured to cause the machine to be positioned at predetermined locations on conductive material of each of the one or more battery objects in the first set of battery objects to be tested, each of the predetermined locations associated with one or more of the predetermined tests;

code configured to cause the machine to perform the one or more of the predetermined tests that is associated with each of the predetermined locations;

code configured to analyze the results of the performed one or more of the predetermined tests and determine if retesting of the performed one or more of the predetermined tests is needed; and code configured to determine if all of the predetermined tests have been performed on the each of the one of more battery objects in the first set.

DESCRIPTION OF THE DRAWING

FIG. 2a shows the test setup of FIG. 1 including post testing processing equipment when the machine is used in a stand-alone operating mode.

FIG. 2b shows the test setup of FIG. 1 including post testing processing equipment when the machine is used in an in-production operating mode.

FIG. 6a is a flowchart for the battery object testing cycle of the machine shown in FIG. 1 when the machine is used in a stand-alone operating mode.

FIG. 6b is a flowchart for the battery object testing cycle of the machine shown in FIG. 1 when the machine is used in an in-production operating mode.

DETAILED DESCRIPTION

Figure 1:
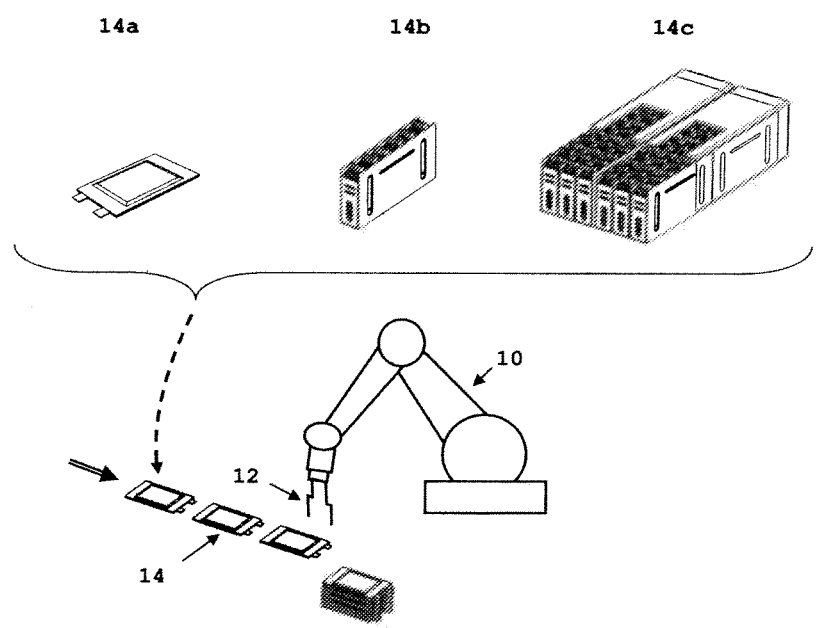
FIG. 1 shows a machine such as an industrial robot that in accordance with the present invention is used to test battery objects and three examples of the battery objects to be tested.

The present invention provides battery testing equipment that has the flexibility and adaptability that is made possible by employing a programmable, position-/velocity controllable machine and also by a test tool held (and controlled, if needed) by the machine.

The present invention may take the form of an entirely hardware embodiment, an entirely software embodiment (including firmware, resident software, micro-code, etc.) or an embodiment combining software and hardware aspects.

Furthermore, the present invention may take the form of a computer program product on a computer-usable or computer-readable medium having computer-usable program code embodied in the medium. The computer-usable or computer-readable medium may be any medium that can contain, store, communicate, propagate, or transport the program for use by or in connection with the instruction execution system, apparatus, or device and may by way of example but without limitation, be an electronic, magnetic, optical, electromagnetic, infrared, or semiconductor system, apparatus, device, or propagation medium or even be paper or other suitable medium upon which the program is printed.

More specific examples (a non-exhaustive list) of the computer-readable medium would include: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a transmission media such as those supporting the Internet or an intranet, or a magnetic storage device.

Computer program code for carrying out operations of the present invention may be written in an object oriented programming language such as Java, Smalltalk, C++, C# or the like, or may also be written in conventional procedural programming languages, such as the "C" programming language, or a Programmable Logic Controller (PLC) code, or a robot specific language such as RAPID available from ABB. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through a local area network (LAN) or a wide area network (WAN), or a data network for specified programmable logic controller (PLC), or the connection may be made to an external computer (for example, through the Internet using an Internet Service Provider).

The invention uses a programmable, position-/velocity controllable machine, which can be a multi-axis industrial machine, typically, but not limited to, an articulated robot arm to perform the testing of the battery object.

The machine, holding a testing tool, performs a contact or non-contact testing action (e.g., touching, connecting, or probing which are contact testing actions, or imaging which is a non-contact testing action) on a set of predefined test locations (e.g., points, region, or areas) on the conducting material of the battery object in order to measure/check the desired specifications and conditions, including but not limited to terminal voltage, terminal current, polarity, impedance, continuity, isolation, and short circuit.

The measurement steps are followed by steps including reporting, classifying, and rejection/acceptance of the cells processed (i.e., measured) in the previous steps.

Because of its flexibility and adaptability, the invention can be applied to many different types of environments: a dedicated (semi-)automatic station; or in-process fully- (or semi-) automated station which can be integrated within the assembly process. Also the method can be applied to different battery object geometries, including prismatic cylindrical and button types.

One example of such a machine is shown in FIG. 1 where the machine is a freestanding six axis industrial robot 10 holding in its end effector 11a suitable apparatus or tool 12 (hereinafter "test tool") that is capable of performing the tests described below on a battery object 14. A robotic tool changer can be used to automatically switch the tools required for the test. Such a tool changer is commercially available from many sources such as for example ATI Industrial Automation of Apex, N.C.

The robot 10 is programmed in a manner well known to those in the robot programming art to perform the testing. The programming may be accomplished either by using a computing device such as a teach pendant or a personal computer (PC) or a programmable logic controller (PLC). As is also well known, a lead-through method may, if applicable, be used for teaching discrete points or continuous-path robot programs. The flow charts of FIGS. 6a and 6b which are described below show the steps associated with the testing method and apparatus of the present invention.

The testing starts with the feeding of a set of battery objects 14 to the testing site. The objects 14 may, as is shown in FIG. 1, be a battery cell 14a or a battery module 14b or a battery pack 14c or a cartridge or cassette which is not shown in FIG. 1. Each battery object 14 should, when it is at robot 10, be in the predetermined position and orientation necessary for robot 10 to correctly perform the tests. Under certain circumstances it may, however, be necessary to use a fixture to hold the battery object 14 to be tested in that predetermined position and orientation or to use a vision controlled robot (not shown) to determine the position and orientation of the battery objects 14 with this second robot having the capability to if necessary reposition and reorient the object prior to its testing by robot 10.

1-a) Probing/Touching or Imaging

The machine 10 brings the test tool 12 into contact with various locations on the conducting material of the battery object 14. The location can be points, surfaces, regions, or areas on the battery object 14. Also a non-contact visual means can be employed using an imaging device (not shown in FIG. 1), which may without limitation be a camera, to inspect the various locations on the conductive material of the battery object 14. The locations can be points, surfaces, regions, or areas on the battery object 14. Such locations may include, but are not limited to:

For objects 14 that are battery cells 14a:
Anode/cathode terminals, leads or tabs,
Housing, pouch case, outer tube, or end caps
Extension tabs
For objects 14 that are Modules/Packs 14b/14c
Anode/cathode terminals, leads or tabs
Housing, case, enclosure, sheathing, or cover plate
Bolt, nuts, or rivet
Bus bars
Heat sink fins
Weld beads
Terminals/wires for voltage, temperature sensor
BMS (Battery Management System)

Each testing category defines several touch/probe or visual inspection regions or points in order to allow a re-trial if the test fails. If that happens, the machine moves to the next trial test region or point and performs the re-test.

1-b) Measurements

There are no simple direct measurements, such as placing a voltmeter across the terminals, to measure the overall performance of the battery object 14. The machine 10 performs measurements such as, but not limited to, the following for checking the battery objects 14:

Open Terminal Voltage (V):
The voltage and current reading between the battery cell cathode & anode should be within the allowable range as designed. The open circuit voltage by itself is not enough to measure the battery's current-supplying capability because the current depends on the internal resistance. Therefore, the internal resistance needs to be taken into account to validate the current-supplying capacity of the battery object 14.

Loaded Terminal Voltage (V):
Voltage reading with a momentary load (or proof load, test load) added in the test circuit.

Terminal Current (A):
Current flow reading during the "loaded" terminal voltage test.

Internal Resistance (or Impedance) (Q):
Measuring the internal resistance is needed in order to calculate the Joule heat generation or $I^2R$ power loss in the battery object 14 under test. However a simple measurement with an ohmmeter-based test tool cannot be incorporated because the current generated by the battery object 14 itself interferes with the measurement. Therefore, the measurement needs to be sequenced through the following steps:

Step 1) Measure the open circuit voltage of the cell.
Step 2) A load is connected across the cell causing a current to flow. This reduces the cell voltage due to the IR voltage drop across the cell that corresponds to the cell's internal resistance.
Step 3) The cell voltage is then measured again when the current is flowing.
Step 4) The resistance is calculated by using Ohms law from the voltage difference between the two measurements and the current which is flowing through the cell.

Another approach to making the internal ohmic measurement is to stimulate the battery object 14 to cause a measurable signal in one of the two ways: i) by pulse discharging the battery; or ii) by applying an AC current signal.

Polarity:
The polarity of the battery object 14 must be checked to identify correct orientation of the battery object in its assembly, or to avoid damage to the entire battery system. The test can be easily done by probing and determining the positive or negative terminals with respect to any reference point (e.g. a frame or chassis ground).

Isolation:
Isolation of a battery is needed to allow DC current to flow only in one direction not in reverse, or allow flow of current only in the path it was designed for (for example, between positive and negative terminals only), in order to ensure that a failure of a single battery object 14 (e.g. a cell, module, or sub pack) will not destroy the entire battery pack or network. The isolation is obtained by several technologies including: silicon rectifier, Schottky rectifier, or MOSFET packages. A commonly used method for the isolation checking is to verify whether the cell pouch is electrically isolated from the tabs.

Continuity:
The battery continuity test is the checking of the battery circuit to see if current flows properly as designed. The continuity test is performed by placing a small voltage across a chosen path. If current flow is inhibited due to broken conductors, damaged components, or excessive resistance, the circuit is open. The continuity tests can be performed by probing to read the current or displaying with a light bulb that lights up when current flows.

Short Circuit:
A short circuit is an abnormal low-resistance connection between two nodes of the battery circuit that are meant to be at different voltages, causing circuit damage, overheating, fire or explosion. The test can be performed by measuring the current flow and resistance between two connection points on the battery object 14.

Charge/Discharge Measurements:
Step 1) The machine 10 identifies cathode & anode connecting points.
Step 2) The machine 10 sends a direct current (DC) pulse having an amplitude specified by the battery manufacturer, between the cathode and anode, for a predetermined duration, to measure battery object voltage and behavior during its pulse charging.
Step 3) The machine 10 discharges the battery object 14 by extracting an appropriate direct current (DC) pulse, between the cathode and anode, for a predetermined duration to measure battery object voltage & behavior during its pulse discharging.

As can be appreciated, it may be necessary to have a separate test tool for some or all of the measurements to be made by machine 10 to measure the overall performance of the battery object 14. For example, suppose N test tools are needed for those measurements. These tools may for example be a first tool which is a probe for the connectivity test, a second tool which is a probe for the resistance test etc. and an Nth tool which is a camera for inspecting the various locations on the conductive material of the battery object 14. To that end, the machine 10 shown in FIG. 1, that is the robot shown in that figure, can carry an "integrated" tool where all N tools are assembled into a single tool permanently attached to the robot, or the robot can carry an individual tool and use a tool changer between each of the N tests to change the tool to the tool that is needed for the next test, or some of the tools are permanently attached to the robot while the robot uses a tool changer to switch to the other tools as needed for some of the N tests.

As also can be appreciated, the machine 10 can have a gripper that is used to pick up the battery object 14 to be tested and bring it to the machine for the testing. The machine then can use other tools including a camera to perform the testing and then use the gripper to return the tested object to the location where it was before testing or to another location and pick up the next battery object to be tested. The gripper can as is described above be part of the single tool or be permanently attached to the machine or be one of the tools that the machine switches to using a tool changer.

1-c) Validation, Rejection, Grading and Classification

Grading and classification of the tested battery object 14 are performed by examining all of (or a part of) the measurement data collected from the previous step. The grading criteria, such as allowable range of battery cell voltage, are dictated by the battery manufacturer's product standard.

1-d) Reporting and Storage

The machine 10 reports and stores all measurement data and grading/classification information of the battery object 14, along with the battery object identifier such as its bar-code, to the central data server which can be the well known supervisory control and data acquisition (SCADA). A suitable device such as a bar code reader can be included in machine 10 or the reader can be one of the tools that the machine switches to using the tool changer.

1-e) Post-Processing

The classified and grouped battery objects (see the step 1-c) above) will undergo one of the following further steps:

A passed battery object of qualified, "current" grade will either be stored at the machine for further processing if machine 10 is used in a stand-alone mode of operation or proceeds to the next assembly step if machine 10 is used in an in-production mode of operation. The stand-alone mode of operation is shown in FIG. 2a and the in-production mode of operation is shown in FIG. 2b. Both of these figures are described below.

A passed battery object of other grades are stored or transferred for the other grade assembly schedule.

A failed battery object is discarded or transferred to further processes (inspection, recycle or repair).

FIG. 2a shows the test setup of FIG. 1 including post processing equipment where machine 10 is used in a stand-alone mode of operation. In this mode of operation, the tested battery objects 14 are graded and based on their grade are placed into an associated one of several bins. The embodiment for this mode of operation in FIG. 2a shows three bins 16, 18 and 20. As can appreciated the number of bins depends on how many grades will be assigned to the tested battery objects. In this embodiment, the battery objects 14 that have been tested and are of the qualified "current" grade are placed by machine 10 in bin 16. The tested battery objects 14 that have passed but are of other grades are placed by the machine 10 in bin 18. The tested battery objects 14 that have failed are placed in bin 20.

FIG. 2b shows the test setup of FIG. 1 including post processing equipment where machine 10 is used in an in-production mode of operation. In this mode of operation, the tested battery objects 14 are graded and those that other than the qualified "current" grade are placed into either bin 16 for those that have passed the test and are not of the qualified "current" grade or bin for those that have failed the test. The tested battery objects 14 that are of the qualified "current" grade are sent to the next assembly stage.

As can be appreciated, in both modes of operation at the end of testing all of the battery objects 14, the associated bins are removed by suitable means for further processing of the tested and graded battery objects. A particular one of the bins can be removed and replaced with an empty bin during the testing if that bin is determined to be full.

2. Adaptability and Flexibility

The present method is applicable to many different types of environments: a dedicated (semi-)automatic station; or in-process fully- (or semi-) automated station. In addition, the method can be applied to different battery geometries, including cylindrical, prismatic, and button types. Examples of the cylindrical, prismatic and button battery cell geometries are shown in FIGS. 3a, 3b and 3c, respectively.

2-a) Different Battery Packaging

Figure 3A:
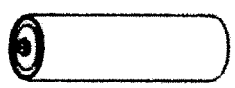
FIGS. 3a, 3b and 3c show respectively cylindrical, prismatic and button type packaging geometries for the battery objects to be tested.
Figure 3B:
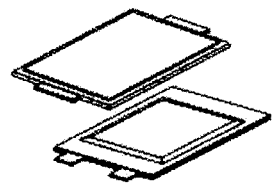
Figure 3C:

As is shown in FIGS. 3a, 3b and 3c, there are three major distinctive packaging geometries in the battery cell product: cylindrical; prismatic; or button type. The cylindrical cell shown in FIG. 3a is the most widely used packaging offering high energy density and provides mechanical stability. The prismatic cell shown in FIG. 3b was devised in response to customer demand for a thinner geometry in certain application areas at the cost of reduced energy density and high production cost. The button cell shown in FIG. 3c is used in certain electronics that have low power demand and benefit from the small cylindrical footprint of the button cell.

2-b) Applicable Battery Assembly Types

As described above, the present method is used for testing a battery object 14, by which as is described above means a battery in all different assembly levels including a cell, a cartridge (or a cassette) a module, and a pack. The battery cell production involves processes, such as stacking of electrode layers, insertion of separators, welding/joining of individual layers, electrolyte injections, and testing. Once a battery cell is completed into a self-contained packaged form, the cells are transferred to and put through a module-level assembly line, where the individual cells are stacked and sub-assembled into a battery module. Finally, the modules are stacked into a final, usable integrated form—a pack.

Figure 4A:
FIGS. 4a, 4b and 4c show three examples of a prismatic type battery object.
Figure 4B:
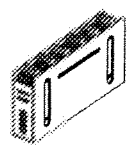
Figure 4C:
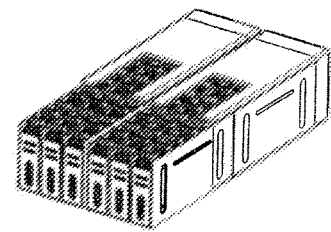
Figure 5A:
FIGS. 5a, 5b and 5c show three examples of a cylindrical type battery object.
Figure 5B:
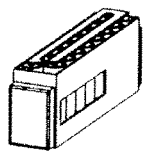
Figure 5C:
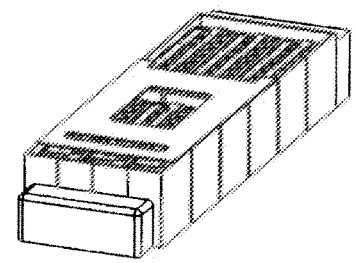

FIGS. 4a, 4b and 4c show three typical examples of battery objects 14 of a prismatic type. FIGS. 5a, 5b and 5c show three typical examples of battery object 14 of a cylindrical type. FIGS. 4a and 5a show the battery object 14 as a cell, FIGS. 4b and 5b show the object 14 as a module and FIGS. 4c and 5c show the object 14 as a pack.

2-c) Applicable Testing Station Configuration

A) Stand-Alone Mode of Operation:

As is described above in connection with FIG. 2a, in this mode of operation of machine 10, the tested battery objects 14 are graded and based on their grade are placed into an associated one of several bins.

Referring now to FIG. 6a, there is shown a flowchart of the testing cycle by a machine 10 of a battery object 14 in the stand-alone mode of operation.

At 600 the program to be executed by the machine 10 during a test cycle is selected. The particular program to be executed by machine 10 depends on the geometry and assembly level of the battery objects 14 to be tested.

After the program is selected, the cycle starts at 602 where a battery object 14 in a set of battery objects is fed to the work station where testing machine 10 is located. The test cycle then proceeds to 604 where the machine 10 is positioned at a predetermined location on the conductive material of the battery object 14 so that the machine 10 can perform one of the predetermined tests described above on the object. If the machine 10 has a tool 12 as shown in FIG. 1, then the tool 12 is at 604 brought into contact with the predetermined location. If instead the machine 10 has as described above a visual means then the machine is positioned so that the visual means views the predetermined location.

The cycle then proceeds to 606 where the predetermined test is performed on battery object 14 and the test data is collected for analysis. The cycle then proceeds to decision 608 where it is asked if the test performed at 606 has failed and if the answer is yes are there other points on the conductive material of the battery object 14 that can be used to perform a re-trial. If there are other points that can be used to perform a re-trial, then the machine 10 at 610 moves to the next re-trial point and at 604 either brings the test tool 12 if the machine has such a tool into contact with the predetermined location on the conductive material of the battery object 14 that is the place where the re-trial is to be performed or if the machine 10 does not have such a tool the machine is positioned so that the visual means views that location.

If the answer to decision 608 is no, that is, the test performed at 606 has not failed, then the cycle proceeds to decision 612 where it is asked if all of the N tests to be performed on the battery object 14 that is being tested are completed. If the answer is no, then the cycle proceeds to 614 where it proceeds to perform the next test on the battery object 14 that is under test. The next test can depending on the type of test be performed either at the same location as that used to perform the prior test or at another location that is associated with the next test.

If the answer to decision 612 is yes, then the cycle proceeds to 616 where based on the test results the tested battery object is graded and classified into a predetermined subgroup and the test results are stored in a data store 618 which can be SCADA. The tested battery object 14 is then at 620 placed in one of the bins such as the bins 16, 18 or 20 shown in FIG. 2a based on the grade and classification assigned at 616 to the tested battery object 14.

As will be appreciated, when all of the N tests are completed on a battery object 14 that is being tested, and the tested object is graded and sorted the sequence described above will be repeated for the next battery object 14 that is to be tested.

B) In-Production Mode of Operation:

As is described above in connection with FIG. 2b, in this mode of operation of machine 10, the tested battery objects 14 are graded and classified and those that are other than the qualified "current" grade are placed into a bin such as bin 16 shown in FIG. 2b for those tested objects that have passed the tested and are not qualified "current" grade or another bin such as bin 18 for those that have failed the test. It should be appreciated that while only two bins are shown in FIG. 2b, there more mat be a multiplicity as those tested objects that are not both qualified "current" grade and failures may be graded and classified into several grades. The tested battery objects 14 that are of the qualified "current" grade are sent to the next assembly stage.

Given the foregoing, the flowchart shown in FIG. 6b has elements 600 to 618 which are identical in function to the same element shown in the flowchart of FIG. 6a and need not be described again. The only differences between the flowcharts is the placing into an associated one of bins such as the bins 16, and 18 of the tested objects that are not either qualified "current" or failures, the picking at 622 of the tested object that has been graded and classified as "qualified" current grade to proceed to the next assembly operation and the retaining at 624 of all of the other tested battery objects.

Figure 7:
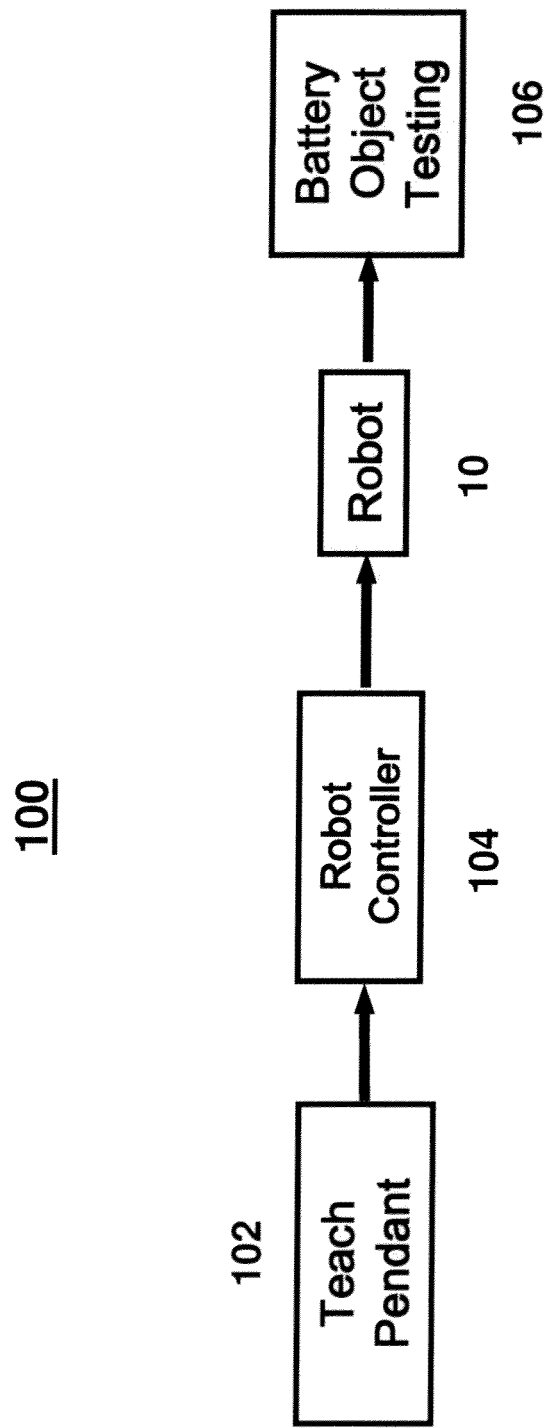
FIG. 7 is a block diagram of a system that can be used to implement the battery object testing.

Referring now to FIG. 7, there is shown a system 100 which may be used to implement the battery objecting testing described above. The system 100 includes a teach pendant 102 connected to robot controller 104 that can be used to program the robot 10 to perform the functions described in the flowcharts shown in FIGS. 6a and 6b. Alternatively, the software program that performs the functions shown in the flowcharts can be created off line and is on a suitable media in a form that can be loaded into the controller 104 or may be downloaded into the controller 104 by well known means from the same site where controller 104 is located or at another site that is remote from the site where controller 104 is located. As another alternative, the software that implements the technique shown in the flowcharts may be resident in controller 104 or the software program may be installed or loaded into a computing device (not shown in FIG. 7) which is connected to controller 104 to send commands to the controller.

As can be appreciated by those of ordinary skill in the art, when the method is implemented in software in controller 104, the controller functions as a computing device to execute the software that implements the technique in the flowcharts shown in FIGS. 6a and 6b. The controller 104 is connected to robot 10 which is used to perform the battery object testing 106. Thus, if the technique is executed by controller 104 or if the controller 104 receives commands from a computing device that executes the technique the robot 10 is controlled to perform the battery object testing 106 in accordance with the present invention. It should be appreciated that the battery object testing technique can be implemented on the robot controller 104 as a software product, or implemented partly or entirely on a remote computer, which communicates with the robot controller 104 via a communication network, such as, but not limited to, the Internet.

It should be appreciated that the battery objects testing machine and method described herein can be used to test battery objects having different geometries and assembly levels. The geometry and assembly level of a battery object are collectively referred to hereinafter as characteristics. As is shown in the flowcharts of FIGS. 6a and 6b, the machine can have stored therein programs for testing of one or more battery objects where there is a program for testing battery objects having one kind of predetermined characteristics and the other programs are each for testing associated battery objects that have other kinds of predetermined characteristics. After the machine has finished testing one or more battery objects having the same kind of characteristics, the machine can be easily reprogrammed to perform the same tests on one or more battery objects having either the same geometry as the one or more previously tested battery objects but not the same assembly level or another geometry with the same assembly level as the previously tested objects or both a geometry or assembly level that is different from that of the previously tested objects. It should be appreciated that the flowcharts shown in FIGS. 6a and 6b are both independent of the characteristics of the one or more battery objects to be tested.

It is to be understood that the description of the foregoing exemplary embodiment(s) is (are) intended to be only illustrative, rather than exhaustive, of the present invention. Those of ordinary skill will be able to make certain additions, deletions, and/or modifications to the embodiment(s) of the disclosed subject matter without departing from the spirit of the invention or its scope, as defined by the appended claims.

What is claimed is:

1. A system for controlling a machine to perform two or more predetermined tests on a battery cell, said system comprising:
  a machine having a tool for performing said two or more predetermined tests, said tool adapted to detect one or more properties of said battery cell said machine adapted to position said tool at two or more predetermined locations on conductive material of said battery cell when said two or more predetermined tests are to be performed; and
  a computing device having therein program code usable by said computing device, said program code comprising:
  code configured to cause said machine to position said tool at said two or more predetermined locations relative to conductive material of said battery cell, each of said two or more predetermined locations associated with one or more of said two or more predetermined tests;
  code configured to cause said machine, and via at least use of said tool, to perform said one or more of said two or more predetermined tests that is associated with a first one of said two or more predetermined locations;
  code configured to analyze the results of said performed two or more predetermined tests and determine if retesting of one or more of said two or more predetermined tests is needed, and, upon determining retesting is needed, to reposition said tool at a second one of said two or more predetermined locations on said conductive material and retest said one or more of said two or more predetermined tests;
  code configured to determine if all of said two or more predetermined tests have been performed on said battery cell and, upon determination, if any, of all of said two or more predetermined tests have not been performed, configured to cause said machine, via use of said tool, to proceed with another of said two or more predetermined tests; and
  wherein said machine is controlled to perform said two or more predetermined tests.

2. The system of claim 1 wherein said program code further comprises code configured when all of said two or more predetermined tests have been performed on said battery cell to assign said tested battery cell one of a predetermined number of grades associated with a tested battery cell.

3. The system of claim 2 wherein said system comprises a predetermined number of receptacles each associated with a respective one of said predetermined number of grades associated with a tested battery cell to receive a tested battery cell that has been given said associated grade.

4. The system of claim 3 wherein one of said predetermined number of assigned grades is for a rejected battery cell and said predetermined number of receptacles includes a receptacle for rejected battery cells assigned said rejected battery cell grade.

5. The system of claim 2 wherein said program code further comprises code configured to select for further processing a tested battery cell based on the grade assigned to said tested battery cell.

6. The system of claim 1 wherein said machine brings said tool into contact with each of said two or more predetermined locations on said conductive material of said battery cell when said tests are to be performed.

7. The system of claim 1 wherein said machine is an industrial robot.

8. A system for controlling predetermined tests on a battery cell, said system, comprising;
  a machine having a tool for performing said predetermined tests, said tool configured to detect one or more properties of said battery cell; and
  a non-transitory computer readable medium comprising;
  computer usable program code configured to cause said machine to displace said tool to two or more predetermined locations relative to said conductive material of said battery cell, each of said two or more predetermined locations associated with one or more of said predetermined tests;
  computer usable program code configured to cause said machine to perform, using at least said tool, said one or more of said predetermined tests that is associated with a first one of said two or more predetermined locations;
  computer usable program code configured to analyze the results of said performed one or more of said predetermined tests and determine if retesting of said performed one or more of said predetermined tests is needed, and, upon determining retesting is needed, to reposition said tool at a second one of said two or more predetermined locations on said conductive material and retest said per formed one or more of said predetermined tests;
  computer usable program code configured to determine if all of said predetermined tests have been performed on said battery cell, and, upon determination, if any, of said predetermined tests having not been performed, configured to cause said machine, via use of said tool, to proceed with another of said predetermined tests; and
  wherein said machine is controlled to perform one or more said predetermined tests.

9. The system of claim 8, said non-transitory computer readable medium further comprising computer usable program code configured to when all of said predetermined tests have been performed on said battery cell assign said tested battery cell one of a predetermined number of grades associated with a tested battery cell.

10. The system of claim 9, said non-transitory computer readable medium further comprising computer usable program code configured to send a tested battery cell that has been given said associated grade to that one of a predetermined number of receptacles that are each associated with a respective one of said predetermined number of grades.

11. The system of claim 10 wherein one of said predetermined number of assigned grades is for a rejected battery cell and said non-transitory computer readable medium further comprises computer usable program code configured to send a battery cell assigned a rejected grade to that one of said predetermined number of receptacles for rejected battery cells.

12. The system of claim 9, said non-transitory computer readable medium further comprising computer usable program code configured to select for further processing a tested battery cell based on the grade assigned to said tested battery cell.

13. The system of claim 8 wherein said a tool includes one or more sensors adapted for performing said predetermined tests and said non-transitory computer readable medium further comprises computer usable program coded for bringing said tool into contact with said predetermined location on said conductive material of said battery cell when said tests are to be performed.

14. The computer program product of claim 8 wherein said machine is an industrial robot.

15. A method for performing predetermined tests on a battery cell comprising:
causing a machine for performing said predetermined tests to be positioned at two or more predetermined locations on conductive material of said battery cell, each of said two or more predetermined locations associated with one or more of said predetermined tests;
causing said machine to perform said one or more of said predetermined tests associated with a first one of said two or more predetermined locations;
analyzing the results of said performed one or more of said predetermined tests and determine if retesting of said performed, one or more of said predetermined tests is needed, and, upon determining retesting is needed, to reposition said tool at a second one of said two or more predetermined locations on said conductive material and retest said performed one or more of said predetermined tests;
determining if all of said predetermined tests have been performed on said battery cell;
and
causing, upon determination, if any, of said predetermined tests are determined to have not been performed, said machine to proceed with another of said predetermined tests.

16. The method of claim 15 further comprising when all of said predetermined tests have been performed on said battery cell to assign said tested battery cell one of a predetermined number of grades associated/with a tested battery cell.

17. The method of claim 16 further comprising sending a tested battery cell that has been given said associated grade to that one of a predetermined number of receptacles that are each associated with a respective one of said predetermined number of grades.

18. The method of claim 17 further comprising when one of said predetermined number of assigned grades is for a rejected battery cell sending a battery cell assigned a rejected grade to that one of said predetermined number of receptacles for rejected battery cells.

19. The method of claim 16 further comprising selecting for further processing a tested battery cell based on the grade assigned to said tested battery cell.

20. The method of claim 15 wherein said machine comprises a tool for performing said predetermined tests and said method further comprises bringing said tool into contact with said two or more predetermined locations on said conductive material of said battery cell when said tests are to be performed.

21. A system for testing battery cells, said battery cells to be tested grouped in a plurality of sets of one or more battery cells, said one or more battery cells in a first of said sets of battery cells having an identical set of characteristics which are different than the set of identical characteristics of one or more battery cells in a second set of battery cells to be tested, said system comprising:
a machine having one or more tools for performing said predetermined tests on each of said battery cells in said first set and second set, said tool configured to detect one or more properties of said battery cell;
a computing device having therein program code usable by said computing device, said program code comprising:
code configured to cause said machine to select from a plurality of testing programs each associated with a respective one of said plurality of sets of battery cells to be tested a testing program associated with said first set of battery cells to be tested, each of said testing programs having a predetermined number of tests to be performed on said associated one of said plurality of sets of battery cells;
code configured to cause said machine to be positioned at two or more predetermined locations on conductive material of each of said one or more battery cells in said first set of battery cells to be tested, each of said two or more predetermined locations associated with one or more of said predetermined tests;
code configured to cause said machine to perform said one or more of said predetermined tests that is associated with a first one of said two or more predetermined locations;
code configured to analyze the results of said performed one or more of said predetermined tests and determine if retesting of said performed one or more of said predetermined tests is needed, and, upon determining retesting is needed, to reposition said tool at a second one of said two or more predetermined locations on said conductive material and retest said performed one or more of said predetermined tests;
code configured to determine if all of said predetermined tests have been performed on said each of said one of more battery cells in said first set and, upon determination, if any, of predetermined tests have not been performed, configured to cause said machine, via use of said tool, to proceed with another of said predetermined tests on each of said one of more battery cells in said first set; and
wherein said machine is controlled to perform one or more of said predetermined tests.

22. The system of claim 21 wherein said one or more tools for performing said predetermined tests on said first set is different than said one or more tools for performing said predetermined tests on said second set.

23. The system of claim 22 wherein said one or more tools for performing said predetermined tests on said first set comprises one or more tools each associated with one or more of said predetermined tests to be performed on each of said battery cells in said first set.

24. The system of claim 23 wherein all of said one or more tools for performing said predetermined tests on said first set are all components of a single tool permanently attached to said machine.

25. The system of claim 23 further comprising a tool: changer adapted to allow said machine to change said one or more tools to that of said one or more tools that is associated with said one or more of said predetermined tests to fee performed on each of said battery cells in said first set.

26. The machine, of claim 21 further comprising a gripper for said machine to pick up and bring to a predetermined testing location each of said battery cells in each of said sets of battery cells to be tested.

\* \* \* \* \*